(12) United States Patent  
Tiefenböck et al.

(10) Patent No.: US 9,278,433 B2  
(45) Date of Patent: Mar. 8, 2016

(54) RECEIVING DEVICE FOR RECEIVING SEMICONDUCTOR SUBSTRATES

(75) Inventors: Herbert Tiefenböck, Andorf (AT); Jürgen Burggraf, Schärding/Inn (AT); Stefan Pargfrieder, Reichenau (AT); Daniel Burgstaller, Neuhofen/Innkreis (AT)

(73) Assignee: EV GROUP GMBH, St. Florian am Inn (AT)

( * ) Notice: Subject to any disclaimer, the term of this patent is extended or adjusted under 35 U.S.C. 154(b) by 896 days.

(21) Appl. No.: 13/138,902

(22) PCT Filed: Mar. 31, 2010

(86) PCT No.: PCT/EP2010/002052  
§ 371 (c)(1),  
(2), (4) Date: Jan. 20, 2012

(87) PCT Pub. No.: WO2010/121701  
PCT Pub. Date: Oct. 28, 2010

(65) Prior Publication Data  
US 2012/0146273 A1   Jun. 14, 2012

(30) Foreign Application Priority Data  
Apr. 22, 2009   (DE) .......................... 10-2009-018-434

(51) Int. Cl.  
*B25B 11/00* (2006.01)  
*H01L 21/683* (2006.01)

(52) U.S. Cl.  
CPC .......... *B25B 11/005* (2013.01); *H01L 21/6838* (2013.01)

(58) Field of Classification Search  
USPC ........................................................ 269/21  
See application file for complete search history.

(56) References Cited

U.S. PATENT DOCUMENTS

| | | | | |
|---|---|---|---|---|
| 3,307,819 A | * | 3/1967 | Cocito .................. | B65G 47/91 137/852 |
| 4,448,404 A | * | 5/1984 | Ogawa .................. | B25B 11/005 269/21 |
| 4,984,232 A | * | 1/1991 | Utsumi ................ | G11B 7/0938 346/137 |
| 5,034,688 A | * | 7/1991 | Moulene ............ | G01R 31/2874 165/80.4 |

(Continued)

FOREIGN PATENT DOCUMENTS

| | | | |
|---|---|---|---|
| JP | 4-152512 | 5/1992 | ............ H01L 21/027 |
| JP | 6-120319 | 4/1994 | .............. H01L 21/68 |

(Continued)

OTHER PUBLICATIONS

Notice of Reasons for Rejection, Japanese Patent Application No. 2012-506359 (Dated Nov. 6, 2013)(including English translation).

(Continued)

*Primary Examiner* — Lee D Wilson  
*Assistant Examiner* — Alvin Grant  
(74) *Attorney, Agent, or Firm* — Kusner & Jaffe

(57) ABSTRACT

A workholding fixture for holding flat semiconductor substrates with
- a carrier,
- a holding body which is fixed or which can be fixed on the carrier with a holding side which faces away from the carrier and
- at least one negative pressure channel which penetrates the holding body with one suction end on the holding side, the holding side having a defined suction structure of soft material.

10 Claims, 2 Drawing Sheets

(56) References Cited

U.S. PATENT DOCUMENTS

| | | | | |
|---|---|---|---|---|
| 5,293,370 | A * | 3/1994 | Beauchamp | G11B 7/26 369/275.5 |
| 5,671,910 | A * | 9/1997 | Davies | B25B 11/005 269/21 |
| 5,738,165 | A * | 4/1998 | Imai | G03F 7/70875 118/728 |
| 5,923,408 | A | 7/1999 | Takabayashi | 355/53 |
| 6,002,161 | A * | 12/1999 | Yamazaki | H01L 23/645 257/531 |
| 6,032,715 | A | 3/2000 | Ohkubo et al. | 156/538 |
| 6,182,957 | B1 * | 2/2001 | Becker | B25B 11/005 269/11 |
| 6,271,676 | B1 * | 8/2001 | Montoya | H01L 21/6838 279/3 |
| 6,272,989 | B1 * | 8/2001 | Misono | B25B 11/005 101/474 |
| 6,383,890 | B2 * | 5/2002 | Takisawa | H01L 21/6838 100/295 |
| 6,540,014 | B2 * | 4/2003 | Getchel | H01L 21/67103 118/728 |
| 6,597,432 | B2 * | 7/2003 | Ida | G03B 27/60 269/21 |
| 6,605,955 | B1 * | 8/2003 | Costello | H01L 21/67109 324/750.09 |
| 6,700,099 | B2 * | 3/2004 | Cole, Sr. | G01R 31/2891 118/724 |
| 6,809,802 | B1 * | 10/2004 | Tsukamoto | G03F 7/707 355/53 |
| 6,836,316 | B2 * | 12/2004 | Tokita | G03F 7/707 355/30 |
| 6,922,387 | B1 * | 7/2005 | Akiyama | G11B 7/007 369/124.12 |
| 7,136,565 | B1 * | 11/2006 | Edwards | B29C 45/0053 264/1.24 |
| 7,221,553 | B2 * | 5/2007 | Nguyen | H01L 21/67109 361/233 |
| 7,331,097 | B2 * | 2/2008 | Stone | H01L 21/67103 165/80.1 |
| 7,556,246 | B2 * | 7/2009 | Suzuki | H01L 21/6838 269/20 |
| 7,660,098 | B2 * | 2/2010 | Ito | G03F 7/70708 361/230 |
| 7,733,625 | B2 * | 6/2010 | Ito | G03F 7/70708 361/230 |
| 8,662,485 | B2 * | 3/2014 | Asada | B24B 37/30 269/21 |
| 8,772,908 | B2 * | 7/2014 | Haba | H01L 23/49838 257/531 |
| 2001/0033543 | A1 * | 10/2001 | Akiyama | G11B 7/007 369/275.4 |
| 2002/0141305 | A1 * | 10/2002 | Yamanaka | G11B 7/00718 369/47.5 |
| 2005/0229854 | A1 * | 10/2005 | Moroz | H01L 21/67248 118/725 |
| 2009/0160018 | A1 * | 6/2009 | Nabeshima | H01L 23/5227 257/531 |
| 2010/0039747 | A1 * | 2/2010 | Sansoni | H01L 21/6833 361/234 |
| 2011/0014858 | A1 * | 1/2011 | Tsai | B24B 37/26 451/527 |

FOREIGN PATENT DOCUMENTS

| | | | | |
|---|---|---|---|---|
| JP | 3312163 | B2 | 7/1996 | B23Q 3/08 |
| JP | 10-321708 | | 4/1998 | H01L 21/68 |
| JP | 2003-152060 | | 5/2003 | H01L 21/68 |
| JP | 2004-259792 | | 9/2004 | H01L 21/68 |
| JP | 2008/218802 | | 9/2007 | H01L 21/683 |
| WO | WO 01/90820 | A1 | 11/2001 | G03F 7/20 |
| WO | WO 2004/011953 | A1 | 2/2004 | G01R 31/26 |
| WO | WO 2008/130173 | A1 | 10/2008 | B65G 47/91 |

OTHER PUBLICATIONS

Office Action (dated May 12, 2014) issued in connection with corresponding Japanese Patent Application No. 2012-506359.

Int'l Search Report (English version only) from corresponding PCT/EP2010/002052 (Form PCT/ISA/210); 3 pages.

Office Action (dated May 20, 2015) issued in connection with corresponding Japanese Patent Application No. 2012-506359.

* cited by examiner

RECEIVING DEVICE FOR RECEIVING SEMICONDUCTOR SUBSTRATES

FIELD OF THE INVENTION

The invention relates generally to a workholding fixture, and more particularly to a workholding fixture for holding flat semiconductor substrates.

BACKGROUND OF THE INVENTION

Precise and positioned fixing of semiconductor substrates is essential for a host of processes in the semiconductor industry. To handle these semiconductor substrates, the generally very thin and susceptible semiconductor substrates are placed on a workholding fixture, a so-called chuck, and fixed there. The technologies known for fixing semiconductor substrates on chucks cannot be used especially for extremely thin semiconductor substrates with a thickness of less than 100 microns, especially less than 50 µm, and for substrates with a topography.

One very frequently used type of fixing takes place using a vacuum or negative pressure, a flat semiconductor substrate being fixed on a flat hardened surface into which vacuum paths are milled. For especially thin semiconductor substrates the semiconductor substrates can break or can at least be damaged along the vacuum paths.

A still greater problem is the fixing of substrates with very high topography, the topography being produced for example by so-called bumps. Bumps are spherically, conically or prismatically (cuboidally) applied conductive materials which are used later for making electrical contact with other components. The bumps can have a height of more than 500 µm, typically between 4-200 µm, generally between 10-150 µm, and can be distributed in a large plurality over the entire substrate surface. It follows from this that fixing of the semiconductor substrate is not sufficiently possible with the known methods.

Another possibility consists in electrostatic fixing. Electrostatic fixing devices however have the disadvantage that damage to the complex circuits on the semiconductor substrate is probable due to build-up of electrical fields.

Therefore the object of this invention is to devise a workholding fixture with which thin semiconductor substrates and semiconductor substrates with topography can be reliably and carefully held and fixed.

SUMMARY OF THE INVENTION

In accordance with the present invention, there is provided a workholding fixture for holding flat semiconductor substrates having a carrier, a holding body which is fixed or which can be fixed on the carrier with one holding side which faces away from the carrier and at least one negative pressure channel which penetrate the holding body with one suction end on the holding side, the holding side having a defined suction structure of soft material.

Advantageous developments of the invention are given in the claims. The framework of the invention also encompasses all combinations of at least two of the features given in the specification, the claims, and/or the figures. In the specified value ranges, values which lie within the indicated limits will also be disclosed as boundary values and they are to be claimed in any combination.

The invention is based on the idea of improving a generic workholding fixture by providing a defined suction structure on one holding side of the workholding fixture with the simultaneous use of a soft surface material or material of the suction structure. By providing a resilient material on the surface which makes contact with the semiconductor substrate, careful holding of the semiconductor substrate can be ensured, even in the presence of a topography on the semiconductor substrate. By the soft material simultaneously having a suction structure which suctions the semiconductor substrate, the disadvantages known from the prior art are avoided and reliable and careful holding of thin semiconductor substrates and/or those provided with a topography is possible.

The distance between adjacent elevations of the suction structure should be in a ratio to the thickness of the semiconductor substrate of less than 1:7, especially less than 1:5, preferably less than 1:3, still more preferably less than 1:2. This applies analogously to the diameters of possible topographies on the semiconductor substrate. The distance between adjacent elevations of the suction structure is accordingly a maximum of 7 times compared to the thickness of the semiconductor substrate and/or to the diameter of individual topographies of the semiconductor substrate which is to be held on the workholding fixture. In one advantageous configuration of the invention it is provided that the suction structure extends over the entire holding side. Thus the entire semiconductor substrate can be carefully held.

Furthermore it is advantageously provided that the suction structure has a Shore hardness of less than 90 Shore-A. A soft material with a Shore hardness between 10 Shore-A and 70 Shore-A is optimum for holding of the semiconductor substrate which is on the one hand stable and on the other careful, since high pressures by load and/or transverse forces can act on the semiconductor substrate to some extent. Moreover, for high-precision positioning of the semiconductor substrate it is necessary that the semiconductor substrate not float on the workholding fixture. But surprisingly it has been found that the combination of soft material and negative pressure also provides for stable lateral guidance or stable lateral fixing.

The holding body with the suction structure can be formed as one part by the holding body consisting of a soft material.

To the extent the defined suction structure has one or more paths which run especially predominantly in the peripheral direction of the holding body and/or of the semiconductor substrate, an especially defined negative pressure can build up over the entire surface of the semiconductor substrate. Moreover a slight negative pressure is sufficient to reliably fix the semiconductor substrate due to the paths which are aligned predominantly in the peripheral direction of the holding body.

In another advantageous embodiment of the invention it is provided that the suction structure, especially of the paths which are adjacent in cross section, is made tooth-like.

It is furthermore advantageously provided that at least one path consisting especially of elevations and depressions runs helically, especially out of the center Z of the holding body. A helical path on the one hand can be easily implemented using production technology and on the other hand a maximum path from the center of the workholding fixture to the periphery of the workholding fixture is implemented so that the negative pressure prevailing on the path is guaranteed to run optimally.

Possible electrostatic changes can be avoided by the soft material being made electrically conductive, for example by grounding of the workholding fixture.

According to another advantageous embodiment of the invention it is provided that the holding side forms a holding plane A and side walls of the depressions are angled to the holding plane A, especially at the same angle, especially in angles W1/W2 between 30° and 85°, preferably between 50° and 70°. The angle W1 applies to the first side wall of the depression and the angle W2 to the second side wall of the depression.

Here it is especially advantageous if the suction structure is made to accommodate topographies of the semiconductor substrate due to the elasticity and geometry of the suction structure.

BRIEF DESCRIPTION OF THE DRAWINGS

Other advantages, features and details of the invention will become apparent from the following description of preferred exemplary embodiments and using the drawings.

DETAILED DESCRIPTION OF PREFERRED EMBODIMENTS

In the figures the same components and components with the same function are identified with the same reference numbers.

Figure 1:
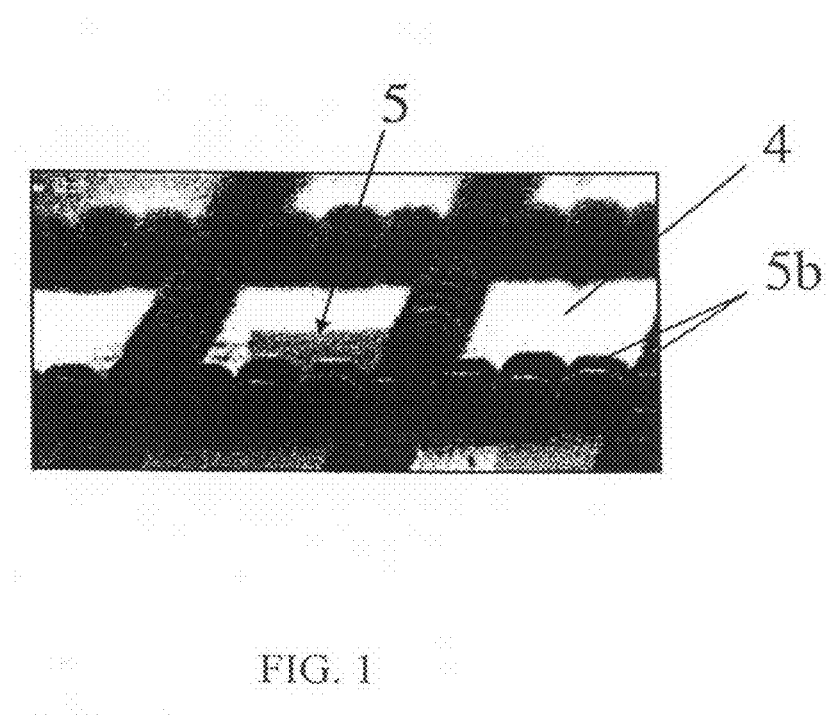
FIG. 1 shows a microscopic photograph of a topography 5 which has been applied to the semiconductor substrate 4 and FIG. 2 shows a schematic of the workholding fixture as claimed in the invention and FIG. 3 shows a schematic extract from the suction structure of soft material as claimed in the invention.

FIG. 1 shows an extract of a semiconductor substrate 4 with a topography 5, specifically individual bumps 5b, which are located distributed on the surface of the semiconductor substrate 4.

Figure 2:
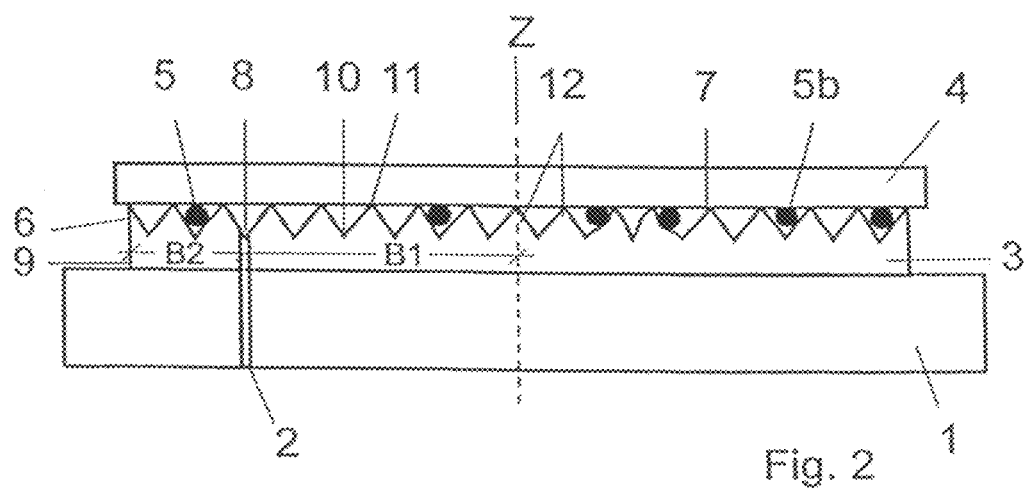

FIG. 2 shows a workholding fixture consisting of a carrier 1 and a holding body 3 which is fixed on the carrier 1. The carrier 1 can be used for example for holding by a robot arm or process station and is therefore formed preferably from rigid material, especially metal. The carrier 1 advantageously has a larger area than the holding body 3. The holding body 3 compared to the carrier 1 is formed from a softer material. The soft material can be for example Viton, silicone, rubber, NBR (nitrile rubbers), neoprene, etc.

The semiconductor substrate 4 with its topography 5 can be held on the holding side 7 of the holding body 3 facing away from the carrier 1. The semiconductor substrate 4 can also be pointed up with its topography 5, therefore can be held away from the holding side 7.

The holding body 3 is penetrated by a negative pressure channel 2 which extends further through the carrier 1 as far as a vacuum means which is not shown for application of a vacuum on one suction end 8 which is located on the holding side 7. As claimed in the invention, several negative pressure channels 2 can be arranged distributed over the holding body 3. An arrangement of the negative pressure channel 2 or of the suction end 8 outside the center Z of the holding body 3 is advantageous. It is especially advantageous if the distance B1 from the center Z to the suction end 8 is larger than the distance B2 from the suction end 8 to the periphery 9 of the holding body 3. A ratio B1:B2 of 1.5:1 to 3:1, preferably 2:1, is especially advantageous.

The suction end 8 is located in a depression 10 of the suction structure 6 and the elevations 11 which form the suction structure 6 are adjacent to the depressions 10. The elevations 11 are tooth-like in this case, the depressions 10 and elevations 11 being formed by a helical path 12 which starts at the center Z. The helical path 12 forms the defined suction structure 6 and high flow resistance from the center Z to the periphery 9 is achieved by the spiral structure and provides for stable suction of the semiconductor substrate 4 on the holding body 3.

The bumps 5b can be held in the depressions 10 of the path 12.

Figure 3:
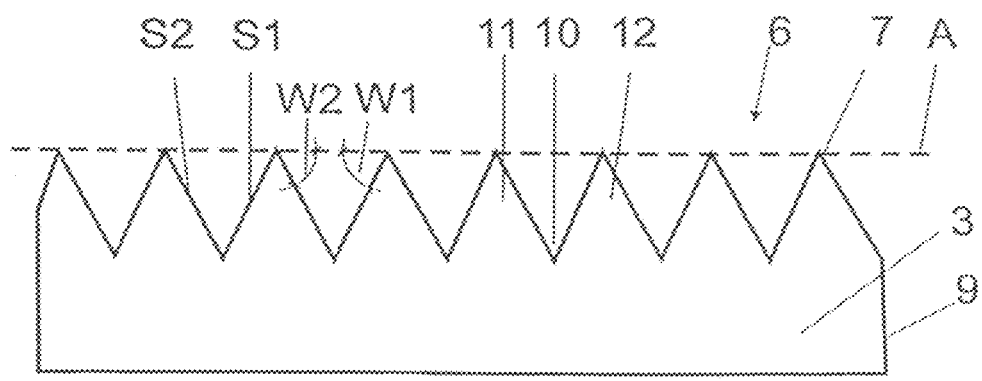

FIG. 3 shows an enlarged extract of the holding body 3. Side walls S1, S2 of the depressions 10 are angled relative to the holding plane A which is formed by the holding side 7 of the holding body 3, at the same angle, with angles W1, W2 which are identical in the exemplary embodiment between the side walls S1, S2 and the holding plane A. The angles W1, W2 are between 30° and 85°, preferably between 40° and 75°.

The elevations 11 which are shown pointed in FIG. 3 can be rounded in one advantageous embodiment of the invention.

One special advantage of the invention lies moreover in that different semiconductor substrates, especially also semiconductor substrates 4 which are also different in diameter, can be reliably and carefully held with the same workholding fixture.

Semiconductor substrates 4 which have essentially the same outside contour and/or the same outer periphery and/or the same diameter as the holding body 3 are held especially reliably and carefully.

The invention claimed is:

1. Workholding fixture for holding flat semiconductor substrates, the workholding fixture including:
a carrier,
a holding body which is fixed or which can be fixed on the carrier with one holding side which faces away from the carrier, and
at least one negative pressure channel which penetrates the holding body with one suction end on the holding side, the holding side having a defined suction structure of soft material for suction of the semiconductor substrate, the soft material being electrically conductive to prevent an electrostatic charge from accumulating on at least one of the semiconductor substrate and the workholding fixture.

2. Workholding fixture as claimed in claim 1, wherein the suction structure extends over the entire holding side.

3. Workholding fixture as claimed in claim 1 or 2, wherein the suction structure has a Shore hardness of less than 90 Shore-A.

4. Workholding fixture as claimed in claim 1, wherein the holding body consists of a soft material.

5. Workholding fixture as claimed in claim 1, wherein the suction structure of paths adjacent especially in cross section, is made tooth-like.

6. Workholding fixture as claimed in claim 1, wherein the holding side forms a holding plane A and side walls (S1/S2) of the depressions are angled to the holding plane A, especially at the same angle, especially in angles W1/W2 which are between 30° and 85°, preferably between 40° and 75°.

7. Workholding fixture as claimed in claim 6, wherein the suction structure is made to accommodate topographies of the semiconductor substrate.

8. Workholding fixture for holding flat semiconductor substrates, the workholding fixture including:
a carrier,
a holding body which is fixed or which can be fixed on the carrier with one holding side which faces away from the carrier, and
at least one negative pressure channel which penetrates the holding body with one suction end on the holding side, the holding side having a defined suction structure of soft material for suction of the semiconductor substrate, wherein the defined suction structure has one or more paths which run especially predominantly in the peripheral direction of the holding body or of the semiconductor substrate, wherein at least one path consists of elevations and depressions and runs helically out of the center (Z) of the holding body and a ratio of a distance between adjacent elevations of the suction structure to a thickness of the semiconductor substrate is less than 1:7, and wherein one end of the at least one path running helically is open to the peripheral edge of the holding body.

9. Workholding fixture for holding flat semiconductor substrates with a carrier, a holding body which is fixed or which can be fixed on the carrier with one holding side which faces away from the carrier, and at least one negative pressure channel which penetrates the holding body with one suction end on the holding side, the holding side having a defined suction structure of soft material for suction of the semiconductor, the soft material being electrically conductive to prevent an electrostatic charge from accumulating on at least one of the semiconductor substrate and the workholding fixture, wherein the defined suction structure is configured to accommodate topographies of the flat semiconductor substrate and wherein the defined suction structure includes a plurality of elevations and a ratio of a distance between adjacent elevations of the suction structure to a thickness of the semiconductor substrate is less than 1:7.

10. Workholding fixture for holding flat semiconductor substrates, the workholding fixture including:

a carrier, a holding body which is fixed or which can be fixed on the carrier with one holding side which faces away from the carrier, and at least one negative pressure channel which penetrates the holding body with one suction end on the holding side, the holding side having a defined suction structure of soft material for suction of the semiconductor substrate, wherein the defined suction structure has one or more paths which run especially predominantly in the peripheral direction of the holding body or of the semiconductor substrate, wherein at least one path consists of elevations and depressions and runs helically out of the center (Z) of the holding body, and wherein one end of the at least one path running helically is open to the peripheral edge of the holding body.

\* \* \* \* \*